US006836114B2

(12) United States Patent
Reddy et al.

(10) Patent No.: US 6,836,114 B2
(45) Date of Patent: Dec. 28, 2004

(54) PULSE IMAGING SEQUENCES AND METHODS FOR T1P-WEIGHTED MRI

(75) Inventors: Ravinder Reddy, Phoenixville, PA (US); Sridhar R. Charagundla, Morton, PA (US); Ari Borthakur, Philadelphia, PA (US); Erik M. Shapiro, Washington, DC (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 10/389,502

(22) Filed: Mar. 14, 2003

(65) Prior Publication Data

US 2003/0218459 A1 Nov. 27, 2003

Related U.S. Application Data

(60) Provisional application No. 60/364,878, filed on Mar. 15, 2002.

(51) Int. Cl.[7] .................................................. G01V 3/00
(52) U.S. Cl. ...................................... 324/307; 324/306
(58) Field of Search ................................ 324/307, 306, 324/309, 312, 314, 300

(56) References Cited

U.S. PATENT DOCUMENTS

| | | | | | |
|---|---|---|---|---|---|
| 5,001,427 | A | * | 3/1991 | Fujiwara ..................... | 324/307 |
| 5,317,264 | A | * | 5/1994 | Rommel et al. ............ | 324/309 |
| 5,404,882 | A | * | 4/1995 | Santyr ........................ | 600/410 |
| 5,420,510 | A | * | 5/1995 | Fairbanks et al. .......... | 324/309 |
| 5,498,962 | A | * | 3/1996 | Sepponen .................... | 324/309 |

OTHER PUBLICATIONS

Akella, S.V., et al., "Proteoglycan induced changes in $T_{1\rho}$ relaxation of articular cartilage at 4T," *Magn. Reson. Med.* 46:419–423 (2001).

Aronen, H.J., et al., "3D spin–lock imaging of human gliomas," *Magn. Reson. Imaging* 17:1001–1010 (1999).

Charagundla, S.R., et al., "[17]O–decoupled $^1$H spectroscopy and imaging with a surface coil: STEAM decoupling," *J. Magn. Reson.* 143:39–44 (2000).

Charagundla, S.R. et al., "Off–resonance proton $T_{1\rho}$ dispersion imaging of [17]O–enriched tissue phantoms," *Magn. Reson. Med.*, 39:588–595 (1998).

Charagundla, S.R. et al., "Dynamic [17]O imaging with fast $T_\rho$ dispersion MRI. Proceedings of the International Society of Magnetic Resonance in Medicine, 7th Scientific Meeting, Philadelphia," 2106 (1999).

Collins, C.M., et al., "SAR and $B_1$ field distributions in a heterogeneous human head model within a birdcage coil," *Magn. Reson. Med.* 40:847–856 (1998).

Dixon, W.T., et al., "Myocardial suppression in vivo by spin locking with composite pulses," *Magn. Reson. Med.* 36:90–94 (1996).

Duvvuri, U., et al., "$T_{1\rho}$–relaxation in articular cartilage: effects of enzymatic degradation," *Magn.Reson.Med.* 38:863–7 (1997).

Duvvuri, U., et al., "Human knee: in vivo $T_{1\rho}$–weighted MR imaging at 1.5 T—preliminary experience[1]," *Radiology* 220:822–826 (2001).

(List continued on next page.)

*Primary Examiner*—Louis Arana
(74) *Attorney, Agent, or Firm*—Evelyn H. McConathy; Dilworth Paxson LLP

(57) ABSTRACT

Provided are pulse imaging sequences and methods for 2D multi-slice $T_{1\rho}$-weighted and 3D $T_{1\rho}$-weighted magnetic resonance imaging (MRI). Further provided is a self-compensating spin-locking sequence for correcting and reducing artifacts in $T_{1\rho}$-weighted imaging. Also provided is a sequence combining 3D $T_{1\rho}$-weighted MRI with a self-compensating spin-locking pulse for facilitating $T_{1\rho}$-weighted imaging with surface coils.

20 Claims, 15 Drawing Sheets

OTHER PUBLICATIONS

Duvvuri, U., et al., "Water magnetic relaxation dispersion in biological systems: The contribution of proton exchange and implications for the noninvasive detection of cartilage degradation," *Proc. Natl. Acad Sci USA* 98:12479–12484 (2001).

Engelhardt, R.T., et al., "$T_{1\rho}$ relaxation and its application to MR histology," *Magnetic Resonance in Medicine* 35:781–6 (1996).

Lattanzio, P.J., et al., "Macromolecule and water magnetization exchange modeling in articular cartilage," *J. Magn. Reson. Med.* 44:840–851 (2000).

Markkola, A.T., et al.,. "Spin lock and magnetization transfer imaging of head and neck tumors," *Radiology* 200:369–375 (1996).

Markkola, A.T., et al., "$T_{1\rho}$ dispersion imaging of head and neck tumors: a comparison to spin lock and magnetization transfer techniques," *J. Magn. Reson. Imaging* 7:873–879 (1997).

Markkola, A.T., et al., "Determination of $T_{1\rho}$ values for head and neck tissues at 0.1T: a comparison to $T^1$ and $T^2$ relaxation times," *Magn. Reson. Imaging* 16:377–383 (1998).

Meiboom, S., et al., "Modified spin–echo method for measuring nuclear relaxation times," *Rev. Sci. Instrum.* 29:688–691 (1958).

Mlynarik, V., et al., "The role of relaxation times in monitoring proteoglycan depletion in articular cartilage [In Process Citation]" *J. Magn. Reson. Imaging* 10:497–502 (1999).

Mow, V.C., et al., "Fundamentals of articular cartilage and meniscus biomechanics. In: W. EJ, eds. Articular cartilage and knee joint function: basic science and arthroscopy," *New York: Raven* (1990).

Mulkern, R. V., et al., "Spin–lock techniques and CPMG imaging sequences: a critical appraisal of $T_{1\rho}$ contrast at 0.15T," *Magn. Reson. Imaging* 7:437–444 (1989).

Poptani, H., et al., "$T_{1\rho}$ imaging of murine brain tumors at $4T^1$," *Acad. Radiol.* 8:42–47 (2001).

Ramadan, U.A., et al. "On– and off–resonance spin–lock MR imaging of normal human brain at 0.1 T: possibilities to modify image contrast," *J. Magn. Reson. Imaging* 16:1191–1199 (1998).

Reddy, R., et al., "Detection of $^{17}O$ by proton $T_{1\rho}$–dispersion imaging," *J. Magn. Reson. B.* 108:276–279 (1995).

Reddy, R., et al., "$^{17}O$–decoupled $^1H$ Detection Using a Double–tuned Coil," *Magnetic Resonance Imaging*, vol. 4, No. 9, pp. 1073–1078, (1996).

Redfield, A.G. "Nuclear Magnetic Resonance Saturation and Rotary Saturation in Solids," *Phys. Rev.* 98:1787 (1955).

Regatte, R.R., et al., "Proteoglycan Depletion–induced Changes in Transverse Relaxation Maps of Cartilage: Comparison of T2 and T1r," *Acad. Radiol.* 9:1388–1394 (2002).

Rizi, R.R., et al., "Proton $T_{1\rho}$–dispersion imaging of rodent brain at 1.9 T.," *J. Magn. Reson. Imaging* 8:1090–1096 (1998).

Rommel, E., et al., "Volume–selective determination of the spin–lattice relaxation time in the rotating frame T1 rho, and $T_{1\rho}$ imaging," *J. Magn. Reson. Med.* 12:209–218 (1989).

Santyr, G.E., et al., "Spin locking for magnetic resonance imaging with application to human breast," *J. Magn. Reson. Med.* 12:25–37 (1989).

Santyr, G.E., et al., "Variation in measured transverse relaxation in tissue resulting from spin locking with the CPMG sequence," *J. Magn. Reson.* 79:28–44 (1988).

Sepponen, R.E., et al., "A Method for $T_{1\rho}$ imaging," *J Comput. Assist. Tomogr.* 9:1007–1011 (1985).

Solomon, I., "Rotary spin echoes," *Phys. Rev. Lett.* 2:301–302 (1959).

Tailor, D., et al., "High Resolution Assessment of Blood Flow in Murine RIF–1 Tumors by Monitoring Uptake of $H_2{}^{17}O$ with Proton $T_{1\rho}$–Weighted Imaging", *Magnetic Resonance in Medicine*, 49:1–6, (2003).

Tailor, D., et al., "Indirect $^{17}O$–Magnetic Resonance Imaging of Cerebral Blood Flow in the Rat", *Magnetic Resonance in Medicine*, 49:479–487, (2003).

Tannus, A., et al., "Adiabatic pulses," *NMR Biomed.* 10:423–434 (1997).

Virta, A., et al., "$T_{1\rho}$ MR imaging characteristics of human anterior tibial and gastrocnemius muscles," *Acad. Radiol.* 5:104–110 (1998).

\* cited by examiner

PULSE IMAGING SEQUENCES AND METHODS FOR T1P-WEIGHTED MRI

REFERENCE TO RELATED APPLICATIONS

This application claims priority to U.S. Provisional Application No. 60/364,878 filed Mar. 15, 2002, herein incorporated by reference in its entirety.

GOVERNMENT SUPPORT

This work was supported in part by National Institutes of Health Research Resource Grant RR02305 and by the Arthritis Foundation and National Institutes of Arthritis and Musculoskeletal and Skin Diseases (NIAMS-NIH) grants RO145252, RO145404 and R21-EB00480. The government may have certain rights in this invention.

FIELD OF THE INVENTION

This invention relates generally to the field of magnetic resonance imaging (MRI). Specifically, the invention relates to spin-locking and $T_{1\rho}$-weighted MRI pulse sequences.

BACKGROUND OF THE INVENTION

Magnetic resonance imaging (MRI) has become the modality of choice for imaging joints due to its excellent definition of ligaments, cartilage, bone, muscle, fat and superior soft tissue contrast (Smith, *Magn. Reson. Imaging Clin. N. Am.* 3:229–248 (1995); Sofka, et al., *Radiology* 5:217–226 (2001)). For two decades, proton magnetic resonance imaging (MRI) has shown its efficacy in the noninvasive analysis of soft tissues, particularly in the diagnosis of tendinomuscular and osteoarticular diseases (Peterfy et al., *Radiol. Clin. North Am.* 34:195 (1996); Peterfy, *Magn. Reson, Imaging Clin. N. Amer.* 8:409–430 (2000)).

Articular cartilage is a connective tissue consisting of relatively few cells and a highly charged and hydrated extracellular matrix (ECM). The constituents of the ECM are proteoglycans (PG), collagen, and non-collagenous proteins and water (Grushko, et al., *Conn. Tiss. Res.* 19:149–176 (1989); Lohmander, *J. Anatomy* 184:477–492 (1994); Mankin, et al., *J. Bone Joint Surg-Am.* 53:523–537 (1971)). Despite its remarkable durability, degeneration of articular cartilage can result from either noninflammatory processes, such as osteoarthritis (OA), or inflammatory processes, such as rheumatoid arthritis (RA). The early stage of OA is associated with loss of PG and changes in water content (Grushko, et al., 1989; Lohmander, 1994). Recent developments in chondroprotective therapies, cartilage grafting, gene therapy and tissue engineering have increased the demand for accurate and non-invasive techniques that will enable the detection of the early biochemical changes of cartilage degeneration in vivo.

Conventional proton MR techniques have been able to provide information about late stages of degeneration in which structural defects are present (Recht, et al., *Am. J. Roent.* 163:283–290 (1994); Peterfy, et al., *Radiol. Clin. North Am.* 32:291–311 (1994)). Recently, delayed gadolinium (Gd)-enhanced proton MRI of cartilage (dGEMRIC) (Bashir, et al., *Magn. Reson. Med.* 36:665–673 (1996); Burstein, et al., *Magn. Reson. Med.* 45:36–41 (2001); Mlynarik, et al., *J. Magn. Reson. Imaging* 10:497–502 (1999)), positively charged nitroxide based techniques (Lattanzio, et al., 25:1024 (2000), and sodium MRI (Reddy, et al., *Magn. Reson. Med.* 39:697–701 (1998); Shapiro, et al., *J. Magn. Reson.* 142:24–31; Shapiro, et al., *Magn. Reson. Med.* 47:284–291 (2002)) have been employed to measure PG changes in cartilage both in vivo and in vitro. However, these techniques have some practical limitations. In dGEMRIC, long waiting period between contrast agent injection and imaging and variation in intra tissue Gd-relaxivity may contribute to the errors in PG quantitation, thereby reducing the accuracy of this technique in the detection of OA. Although sodium MR imaging has high specificity towards proteoglycans, it has an inherently low sensitivity and requires special radio-frequency hardware modifications before it can be used with a routine clinical imaging unit.

Spin lattice relaxation time in the rotating frame ($T_{1\rho}$) has been shown to be sensitive to changes in PG content of cartilage (Duvvuri, et al., *Magn.Reson.Med.* 38:863–867 (1997); Akella, et al., *Magn. Reson. Med.* 46:419–423 (2001)). It is well suited for probing macromolecular slow motions at high static fields without modifying MR system hardware (Sepponen, et al, *J, Computer Assisted Tomography* 9:1007–1011 (1985); Santyr, et al., *Magn. Reson. Med.* 12:25–37 (1989)).

$T_{1\rho}$ provides an alternative contrast compared to conventional MRI methods. Since the first description by Redfield (*Phys. Rev.* 98:1787 (1955)), spin-locking technique has been used extensively, to investigate the low frequency interactions between the macromolecules and bulk water. Several authors have investigated the $T_{1\rho}$ dispersion characteristics of biological tissues, including brain (Aronen, et al., *Magn. Reson. Imag.* 17:1001–1010 (1999); Rizi, et al., *J Magn Reson Imaging* 8:1090–1096 (1998)), tumors (Aronen, et al., *Magn. Reson. Imag.* 17:1001–1010 (1999); Markkola, et al., *Radiology* 200:369–375 (1996)), and articular cartilage (Mlynarik, et al., 1999; Akella, et al., 2001; Duvvuri, et al., 1997; Duvvuri, et al., *Radiology* 220:822–826 (2001)). These studies have demonstrated the potential value of $T_{1\rho}$-weighting in evaluating various physiologic/pathologic states.

Although recent studies have demonstrated the potential role of $T_{1\rho}$-weighted MRI in measuring cartilage degeneration, they all have been restricted to single slice imaging, and hence, are impractical for the imaging of a typical anatomic volume. The use of single slice techniques results from the problem in making the spin-locking pulse slice selective. A 2D multi-slice $T_{1\rho}$ MRI sequence has not been implemented since the use of a nonselective spin-lock (SL) pulse poses a challenge to slice-selective imaging. Multi-slice imaging requires the application of multiple radio frequency (RF) pulse trains within a sequence repetition time (TR) to excite several slices in a time efficient manner. Currently, $T_{1\rho}$ pulse sequences employ a nonselective RF pulse to spin-lock the magnetization in the transverse plane following the application of a non-selective π/2 pulse. As a result, using this method, the spin-lock pulse excites signals from the entire sample during each application, but the subsequent imaging sequence acquires data from only a single slice, wasting the information from the remainder of the volume. Accordingly, a need has remained until the present invention for a method to perform multi-slice $T_{1\rho}$-weighted MRI.

Furthermore, in addition to the improved ability to image anatomic regions through 2D multi slice imaging, a 3D image provides even better contrast and faster acquisition than a 2D image. Even though a 3D, gradient-echo readout of a $T_{1\rho}$-weighted MR signal has been used (Aronen, et al., 1999), that sequence was implemented on a low field magnet (0.1T) with a combination of adiabatic pulses, and RF spoiling alone was employed to destroy unwanted transverse coherence. The use of adiabatic pulses has certain drawbacks. Their long pulse lengths result in substantial decay of magnetization during the pulse period. These pulses cannot be easily calibrated on a clinical scanner, are more RF power intensive and may introduce specific absorption rate (SAR) issues. Moreover, any residual transverse magnetization resulting from incomplete restoration of the $T_{1\rho}$-prepared magnetization to the longitudinal axis by the second adiabatic pulse will result in unwanted image artifacts.

The need has remained for a MR pulse sequence capable of performing 3D $T_{1\rho}$-weighted MRI imaging on a high field clinical scanner. However, when using high field clinical scanners (greater than or equal to 1.5T), the SAR by the pulse sequence is significant, and imaging parameters must be chosen such that the energy deposition does not exceed the established SAR guidelines. Hence, determining the optimal sequence parameters has been necessary, so that the energy deposition by the radio frequency pulses in the sequence, measured as the SAR, does not exceed safety guidelines for imaging human subjects.

Additionally, significant artifacts arise in $T_{1\rho}$-weighted imaging when nutation angles suffer small deviations from their expected values. These artifacts vary with spin-locking time and amplitude, severely limiting attempts to perform quantitative imaging or measurement of $T_{1\rho}$ relaxation times. As a result, a need has also remained for a "self-compensating" spin-locking pulse that dramatically reduces artifacts and provides a more robust implementation of $T_{1\rho}$ imaging despite spatial variations in nutation angles.

Finally, $T_{1\rho}$-weighted MRI in volume coils has been employed to improve tissue contrast (Markkola, et al., *J. Magn. Reson. Imaging* 7:873–879 (1997); Santyr, *Magn. Reson. Imaging Clin. N. Am.* 2:673–690 (1994)). However, the use of surface coils is attractive due to their signal-to-noise ratio (SNR) characteristics, especially when used on extremities. Inhomogeneous $B_1$ profiles of surface coils produce undesired image artifacts that prevent conventional $T_{1\rho}$-weighted imaging. Accordingly, a need has remained for combining 3D $T_{1\rho}$-weighted MRI and a self compensating spin-lock pulse to obtain artifact-free 3D $T_{1\rho}$-weighted MRI using surface coils.

SUMMARY OF THE INVENTION

The present invention provides novel $T_{1\rho}$-weighted imaging pulse sequences for 2D multi-slice and 3D $T_{1\rho}$ MR imaging. Also provided is a pulse sequence for correction of artifacts with a self-compensating spin-locking pulse.

In one aspect of the present invention, a 2D multi slice $T_{1\rho}$-weighted MR imaging pulse sequence is provided. The pulse sequence comprises a first $\pi/2$ pulse for selectively exciting a band of spins that are spin-locked in the transverse plane by the application of a train of spin-locking pulses with alternating phase (±90° phase-shifted from the phase of the first $\pi/2$ pulse), a second slice-selective $\pi/2$ pulse which restores the spin-locked magnetization to the longitudinal axis for imaging with any pulse sequence, and a strong "crusher" gradient applied to destroy any residual transverse magnetization. Also provided is a method for obtaining 2D multi-slice $T_{1\rho}$-weighted MR images In another aspect of the invention, a self-compensating spin-locking pulse sequence for correcting artifacts in $T_{1\rho}$-weighted imaging is provided. A preferred embodiment of the self-compensating spin-locking pulse comprises a four-pulse preparatory cluster, further comprising a $\pi/2$ pulse ($P_1$) which nutates magnetization into the transverse plane, followed by a spin-locking pulse (SL) with phase-shift of 90° and amplitude $B_{s1}$, which is applied for some time TSL/2, then an SL pulse with phase-shift of −90° and amplitude $B_{s1}$, and a final $\pi/2$ pulse ($P_2$) which is applied, phase-shifted by 180° to return the $T_{1\rho}$-relaxed magnetization to the longitudinal axis for imaging. $B_{s1}$ is some fraction of the maximum available RF field $B_1$. A crusher gradient is then applied to dephase any residual longitudinal magnetization. Additionally, a method of correcting for artifacts in $T_{1\rho}$-weighted MR imaging is provided.

In yet another aspect of the invention there is provided a 3D $T_{1\rho}$-weighted pulse sequence for MR imaging. A preferred embodiment of the 3D $T_{1\rho}$-weighted pulse sequence comprises: a first $\pi/2$ hard pulse; a spin-lock pulse having amplitude $B_1$; a second $\pi/2$ hard pulse phase-shifted 180 degrees from the first hard pulse; and a strong "crusher" gradient applied before the $\alpha$ pulse to destroy any residual magnetization in the transverse plane and prevent the formation of unwanted coherences. A method of obtaining 3D $T_{1\rho}$-weighted MR images is also provided. In yet another embodiment a method of obtaining 3D $T_{1\rho}$-weighted MR images with a surface coil is provided.

Additional objects, advantages and novel features of the invention will be set forth in part in the description, examples and figures which follow, and in part will become apparent to those skilled in the art on examination of the following, or may be learned by practice of the invention.

DESCRIPTION OF THE DRAWINGS

The foregoing summary, as well as the following detailed description of the invention, will be better understood when read in conjunction with the appended drawings. For the purpose of illustrating the invention, there are shown in the drawings, certain embodiment(s) which are presently preferred. It should be understood, however, that the invention is not limited to the precise arrangements and instrumentalities shown.

FIG. 2A show results from a conventional spin-echo multi-slice sequence. FIG. 2B shows the poor quality results due to saturation of the magnetization of multi-slice imaging without phase alternating the spin-lock pulses. FIG. 2C shows the correction for the image signal loss by phase alternating the spin-lock pulses. FIG. 2D shows increasing the TR from 500 ms in images FIGS. 2A–2C to 5 seconds produces a high signal intensity image comparable to the original spin-echo image.

FIG. 9A shows the position of an agarose gel phantom within a coil and the overlaid sketch shows the typical position of the knee inside the coil. FIGS. 9B–D show the measured increase in temperature, with varying TRs, in the phantom after the 3D sequence from FIG. 9A. FIG. 9B shows the image with a of TR of 138 ms, FIG. 9C is with a TR of 100 ms and FIG. 9D is with a TR of 75 ms.

FIG. 12A shows a $T_{1\rho}$ relaxation map of a healthy knee. FIG. 12B shows a $T_{1\rho}$ relaxation map of a subject with clinical symptoms of osteoarthritis.

FIG. 13A is a control $T_2$ map. FIG. 13B is a control $T_{1\rho}$ map. FIG. 13C is a 40% PG depleted $T_2$ map. FIG. 13D is a 40% PG depleted $T_{1\rho}$ map.

FIGS. 14A and 14B show images obtained with the self-compensating method with an SL pulse divided into four segments and two segments, respectively. FIGS. 14C and D show images obtained with the conventional method, with one SL pulse and the SL pulse turned off, respectively.

DESCRIPTION OF PREFERRED EMBODIMENTS OF THE INVENTION

The present invention provides novel $T_{1\rho}$-weighted MR imaging sequences and methods for use thereof. The novel sequences provide better imaging delineation and improved methods for in vivo use. These pulse sequences provide 2D multi slice $T_{1\rho}$-weighted MRI and 3D $T_{1\rho}$-weighted MRI for high field magnets.

The $T_{1\rho}$ images show better contrast and higher signal-to-noise ratio (SNR) than $T_2$-weighted images. The improved SNR is due to the effect of spin locking. In $T_2$-weighted images, spins dephase through diffusion through inhomogeneities and susceptibility variations caused by internal and applied gradients. In $T_{1\rho}$-weighted images, spin-locking reduces diffusion losses and susceptibility artifacts and gives $T_{1\rho}$ contrast (Engelhardt, et al., *Magnetic Resonance in Medicine* 35:781–786 (1996)). Also spin locking minimizes the dipolar couplings and chemical exchange that lead to decrease in $T_2$ relaxation times. The higher SNR and improved contrast between cartilage and surrounding fat of $T_{1\rho}$ imaging provides better definition of lesions and accurate quantification of small changes in cartilage degeneration. Thus, $T_{1\rho}$ relaxation mapping can be used to quantify the early degenerative changes in cartilage in vivo.

2D Multi-Slice $T_{1\rho}$-Weighted Pulse Sequence

Figure 1:
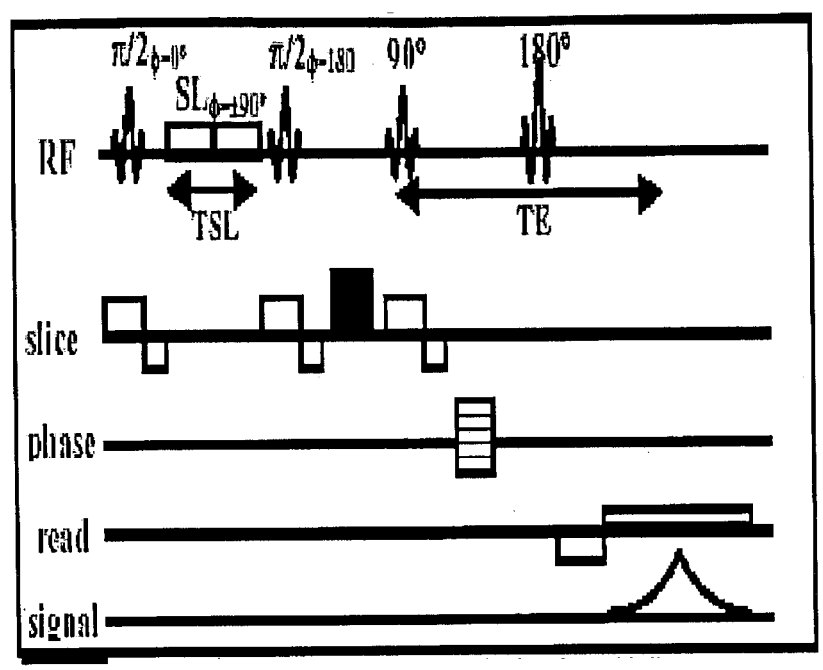
FIG. 1 depicts a preferred embodiment of a timing diagram of a pulse sequence for 2D multi-slice $T_{1\rho}$-weighted MRI.

In one embodiment of the present invention, a novel imaging pulse sequence to perform multi-slice $T_{1\rho}$-weighted MRI is provided. The pulse sequence for 2D multi-slice $T_{1\rho}$-weighted MRI is shown in FIG. 1. The first π/2 pulse selectively excites a band of spins that are spin-locked in the transverse plane by the application of a pulse train, e.g., two pulses as shown in FIG. 1, spin-lock (SL) pulses with alternating phase (±90° phase-shifted from the phase of the first π/2 pulse). During the application of such a pulse train, only the spins that were excited by the π/2 pulse will be spin-locked and off-axis spins will nutate back-and-forth and not achieve any spin-locking. The second slice-selective π/2 pulse then restores the spin-locked magnetization to the longitudinal axis for imaging with any pulse sequence, e.g., a spin-echo readout train. A strong "crusher" gradient (indicated as a filled square block in FIG. 1) is applied to destroy any residual transverse magnetization. The images thus obtained are $T_{1\rho}$-weighted but also contain some degree of $T_1$ weighting, which can be reduced by increasing the TR of the pulse sequence.

A critical element of the 2D multi-slice pulse sequence is the phase alternating spin-lock pulses. As discussed previously, multiple radio frequency (RF) pulse trains are required to excite multiple slices. However, at the same time, a non-selective spin-lock pulse excites and saturates the signal from the entire sample, and thereby wipes out the signal from all but a single slice. Hence, the sequence of the present invention provides a phase alternating spin-locking pulse. In the embodiment of FIG. 1, the second half of the spin-locking pulse is phase-shifted by 90 degrees with respect to the first half. However, any number of spin-locking pulses may be used so long as the number of phase alternating pulses are balanced.

The pulse sequence as shown in FIG. 1 was implemented on a 4.7 T horizontal-bore MRI scanner controlled via a Varian console. Two 5 cm-long water-filled tubes were imaged with a 3 cm-diameter quadrature birdcage coil. The imaging parameters were: FOV=2 cm×2 cm, five slices with thickness=1 mm, TE=15 ms were obtained with varying TR (500 ms and 5 s), TSL (1 pulse 5 ms long and two phase-alternated pulses each 2.5 ms long). For comparison, a 2D multi-slice spin-echo data set with identical imaging parameters (but no $T_{1\rho}$-preparation pulses) and a TR=500 ms was also obtained.

Figure 2:
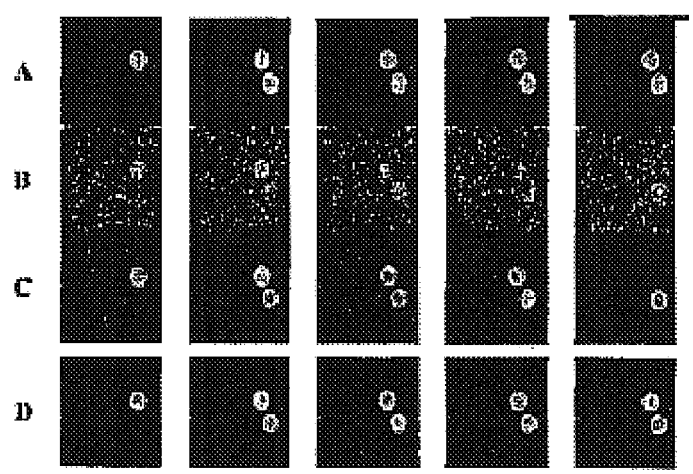
FIGS. 2A–D show MR images for two tubes across five slices.

Results from the conventional spin-echo multi-slice sequence (FIG. 2A) show the two tubes across the five slices. The two tubes were displaced from each other along their long axes so that only one tube was visible in the first slice. As shown in FIG. 2B, without phase alternating the SL pulses, multi-slice imaging results in a poor quality image due to saturation of the magnetization. However, as shown in FIG. 2C phase alternating the SL pulses corrects for the image signal loss. At the same time, the signal is lower than that of the spin-echo images due to the loss of any steady-state signal from transverse coherence in the spin-locked images due to the presence of a crusher gradient. As a result, increasing the TR from 500 ms in images FIGS. 2A–C to 5 seconds in image FIG. 2D produces a high signal intensity image, comparable to the original spin-echo image. The distorted signal seen in the center of the tubes in images 4 and 5 in rows FIGS. 2B–D are due to a $B_0$ inhomogeneity produced by an air bubble at the end of the tubes resulting in an improper spin-lock magnetization.

Self-Compensating Spin-Locking Pulse Sequence

As described above, in order to accomplish the 2D $T_{1\rho}$-weighted multi slice imaging, the pulse sequence required a phase alternating spin-lock pulse. However, as shown above, in addition to allowing the readout of multi-slice signals, the phase alternating spin-lock pulses also provide a "self-compensating" spin-locking pulse, which dramatically reduces the image artifacts and provides a more robust implementation of $T_{1\rho}$ imaging, despite spatial variations in RF field $B_1$. Artifacts in $T_{1\rho}$-weighted imaging are created by $B_0$ inhomogeneity and by variations in the RF field (inhomogeneous $B_1$). The self-compensating pulse of the present invention corrects for artifacts created from both sources.

In an alternative embodiment as described above, and as shown in FIG. 1, the self-compensating spin-locking pulse comprises a four-pulse preparatory pulse cluster pre-appended to a fast spin-echo (FSE) imaging sequence. FIG. 1 shows the self-compensating spin-locking pulse split into two halves, or two pulses, of opposed phase. However, the pulse can be divided into an arbitrary number of smaller pulses, as long as the positively and negatively phased portions of the pulse are balanced. Additionally, although FIG. 1 shows a first and second π/2 slice selective pulse, in an alternate embodiment of the four-pulse preparatory cluster of the self-compensating spin-locking pulse, hard π/2 pulses may replace the slice selective pulses. Additionally, in alternate embodiments, any arbitrary flip angle θ pulse may replace the π/2 pulse.

In an alternative embodiment, the four-pulse preparatory cluster comprises a hard π/2 pulse ($P_1$) which nutates magnetization into the transverse plane. This is followed by a spin-locking (SL) pulse with phase-shift of 90° and amplitude $B_{s1}$, which is applied for some time TSL/2, then an SL pulse with phase shift of –90° and amplitude $B_{s1}$, and a final hard π/2 pulse ($P_2$). $P_2$ is applied, phase-shifted by 180° to return the $T_{1\rho}$-relaxed magentization to the longitudinal axis for imaging. $B_{s1}$ is some fraction of the maximum available RF field $B_1$. A crusher gradient is then applied to dephase any residual longitudinal magnetization. Where there is variation of $B_1$, $P_1$ and $P_2$ perform some arbitrary flip angle θ.

Additionally, $T_{1\rho}$ weighted imaging with a self-compensating spin-locking pulse allows the use of a surface coil, despite large spatial variations in $B_1$. Use of this pulse sequence generates relatively artifact-free images, facilitating quantitative $T_{1\rho}$ imaging while exploiting the sensitivity and convenience of surface coils. The self-compensating spin-locking pulse corrects for artifacts and yields homogeneous images, despite large variations in flip angle. In addition, with manipulation of the preparatory pulse cluster, the same imaging sequence can be utilized for $B_1$ mapping, as well as data acquisition.

3D $T_{1\rho}$-Weighted Pulse Sequence

In another embodiment of the present invention, a 3D $T_{1\rho}$-weighted pulse sequence is provided. This pulse sequence combines superior contrast with high signal to noise characteristics offered by the $T_{1\rho}$ pulse-cluster utilizing hard π/2 pulses with the speed and fat-suppression capability of a 3D spoiled gradient echo (SPGR) sequence. The calculated SAR of the 3D $T_{1\rho}$-weighted sequence determines optimal imaging parameters for $T_{1\rho}$-weighted images in vivo. Furthermore, the temperature increase in a $CoCl_2$-doped agarose gel phantom resulting from the use of these imaging parameters, shows that the sequence can be safely performed in vivo.

As previously described, there are at least two advantages of a 3D $T_{1\rho}$-weighted technique, when compared with 2D $T_{1\rho}$-weighted. First, the 3D $T_{1\rho}$ MRI allows rapid acquisition of the entire anatomic region, in contrast to the single section 2D technique. Second, 3D $T_{1\rho}$-weighted MRI generates better demarcation between cartilage and bone marrow (fat) and fluid by suppressing the fluid and fat signals when compared with 2D $T_{1\rho}$-weighted techniques. The main reason for this fat-suppression is that in the 2D $T_{1\rho}$-weighted technique, the three pulse cluster is pre-encoded with a fast-spin-echo (FSE) imaging sequence, whereas in 3D $T_{1\rho}$-weighted MRI, the pulse cluster is pre-encoded with a gradient echo (GRE) sequence. In 2D $T_{1\rho}$-weighted sequence (FSE readout) the four 1800 refocusing pulses (ETL=4) have a decoupling effect (elimination of J-coupling modulation effects), resulting in a higher fat signal in contrast to 3D $T_{1\rho}$-weighted sequence (GRE readout).

Figure 3:
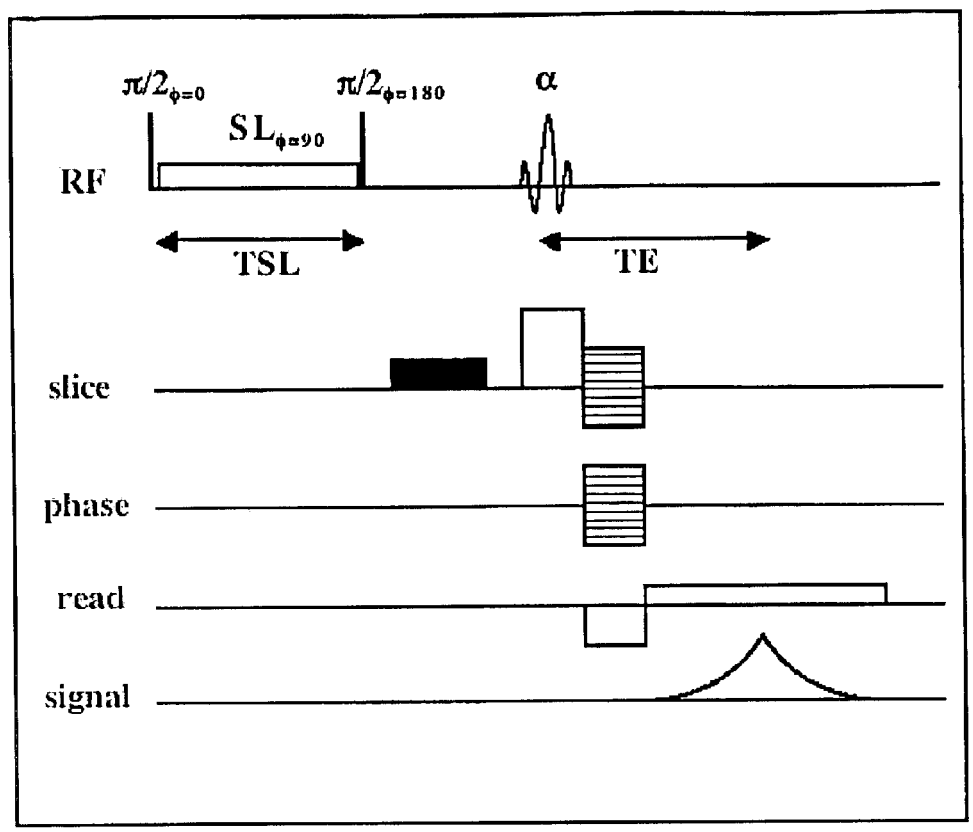
FIG. 3 shows a preferred embodiment of a 3D $T_{1\rho}$ MRI pulse sequence.

The 3D $T_{1\rho}$ MRI pulse sequence is shown in FIG. 3. The first three RF pulses prepare the $T_{1\rho}$-weighted magnetization. The amplitude of the SL pulse, $B_1$, is typically given as the nutation frequency ($\gamma B_1$, where $\gamma$ is the gyromagnetic constant of H nuclei in Hz/T). A strong "crusher" gradient (indicated by the solid block) is applied before the α pulse to destroy any residual magnetization in the transverse plane, and to "inhibit," meaning a statistically significant reduction up to the point of preventing, the formation of unwanted coherences. The signal is spatially encoded in a 3D fashion following the α pulse. The steady-state signal expression is simply solved from the Bloch equation (Aronen, et al., 1999):

$$S(TSL) \propto \frac{e^{\frac{-TSL}{T_{1\rho}}}\left(1-e^{\frac{-(TR-TSL)}{T_1}}\right)}{1-e^{\frac{-TSL}{T_{1\rho}}}e^{\frac{-(TR-TSL)}{T_1}}\cos\alpha}\sin\alpha \qquad \text{(Equation 1)}$$

where TR is the time between subsequent α imaging pulses, TSL is the length of the SL pulse and $T_1$ is the spin-lattice relaxation time constant of the tissue of interest.

The optimal imaging parameters were determined from the SAR calculation. The SAR was calculated from the electric field generated by a typical quadrature coil on a simulated head of known tissue electrical properties and material density (Collins, et al., *Magn. Reson. Med.* 40:847–856 (1998)). The SAR, of a single pulse of flip angle α and duration τ (in ms), is calculated with Equation 2:

$$SAR(\alpha, \tau) = f\left(\frac{3}{\tau}\right)^2 \left(\frac{\alpha}{90°}\right)^2 SAR(90°, 3) \qquad \text{(Equation 2)}$$

where f is a shape factor, equaling 1 for a hard pulse, or equaling the width of the central lobe at the zero crossing point for a sinc pulse. The minimum TR for the pulse sequence was determined from Equation 3:

$$TR = \frac{\sum_{n=1}^{N} SAR(\alpha_1, \tau_1) \times \tau_1}{SAR_{FDA}} \qquad \text{(Equation 3)}$$

where SAR ($\alpha_1 \tau_1$) was calculated from Equation 2 for all four pulses in the sequence and $SAR_{FDA}$ is the FDA suggested maximum SAR level.

Pulse Sequence for 3D $T_{1\rho}$-Weighted MRI with a Surface Coil

In yet another embodiment of the present invention, the 3D $T_{1\rho}$-weighted MRI is combined with the self compensating spin-lock pulse, thereby creating a 3D pulse sequence that facilitates $T_{1\rho}$-weighted MRI with surface coils. In this sequence, the SL pulse is divided into multiple, even-numbered segments of equal duration with alternating phases. By combining a self-compensating spin-lock pulse with a 3D imaging sequence, an artifact-free $T_{1\rho}$-weighted MR image with a surface coil is obtained. This sequence can also be used with volume radio frequency coils to obtain artifact free 3D $T_{1\rho}$-weighted images.

Figure 4:
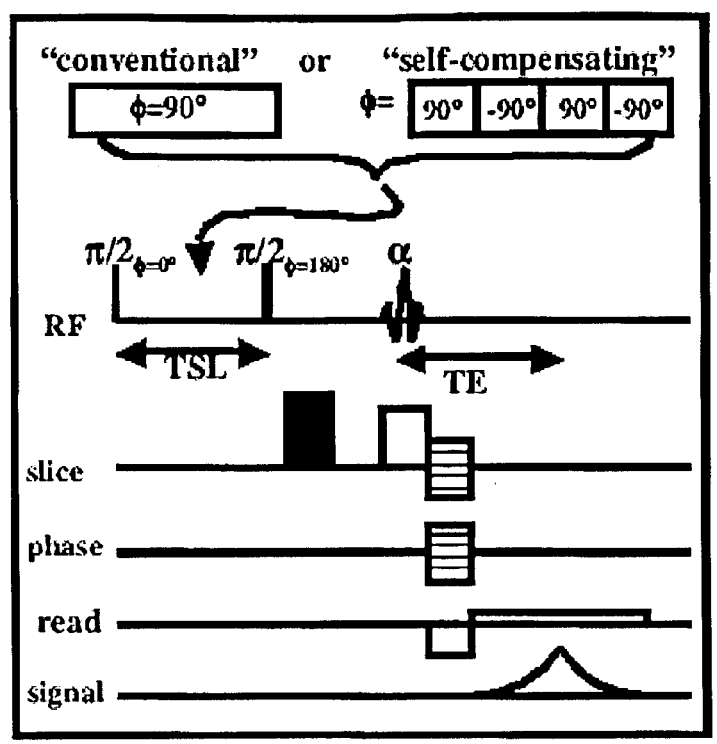
FIG. 4 shows a preferred embodiment of a 3D $T_{1\rho}$-weighted pulse sequence for obtaining 3D $T_{1\rho}$-weighted MR images with a surface coil.

The 3D $T_{1\rho}$ MRI pulse sequence of this embodiment is shown in FIG. 4. The spin-lock pulse is either a single pulse with a constant phase and duration TSL ("conventional"), or it is divided into even number of segments with alternating phase and equal durations ("self-compensating"). A strong crusher gradient, shown as solid block in the slice gradient axis, is applied to destroy any residual magnetization in the transverse plane. This sequence provides a method to obtain artifact-free $T_{1\rho}$-weighted MRI with surface coils.

EXAMPLES

The present invention is further described in the following examples in which experiments were conducted to validate the pulse sequences and show particular applications for the pulse sequences. These examples are provided for purposes of illustration to those skilled in the art, and are not intended to be limiting unless otherwise specified. Moreover, these examples are not to be construed as limiting the scope of the appended claims. Thus, the invention should in no way be construed as being limited to the following examples, but rather, should be construed to encompass any and all variations which become evident as a result of the teaching provided herein.

Example 1

Qualitative Validation

To confirm that images using $T_{1\rho}$-weighted pulse sequences provide improved contrast between cartilage and surrounding fat over images using $T_2$ weighted sequences, $T_{1\rho}$ relaxation maps were computed and compared to $T_2$ relaxation maps for a human wrist cartilage. Additionally, the $T_{1\rho}$ times dependence on spin-locking amplitude ("$T_{1\rho}$ dispersion") was computed to show changes in $T_{1\rho}$ associated with pathology.

$T_2$ and $T_{1\rho}$ experiments were performed on a 1.5 Tesla GE Signa clinical MR system (SIGNA, GEMS, Milwaukee, Wis.) on wrist joints of five healthy volunteers with no known history of arthritis or pain (5 male with mean age 30 years). The radio frequency (RF) coil was placed to the side of the volunteer and strapped to the bed to minimize the errors due to motion. A one inch thick foam was placed in between the volunteer's body and coil to avoid signal interference from the body. The wrist was placed in a custom built, 9.5 cm inner diameter, quadrature birdcage coil tuned to a proton frequency of 63.75 MHz. Coronal plane provided the clearest definition of important structures in the wrist joint. Single slice $T_{1\rho}$ measurements were performed with a 2D fast spin echo (FSE) sequence pre-encoded with a three pulse cluster consisting of two 90 degree hard pulses separated by a low power pulse for spin-locking.

Imaging parameters were: TR/Eff. TE (effective echo time)=3000 ms/15 ms; ETL=4; FOV=8 cm×8 cm; slice thickness=3 mm; data matrix=256×128 and spin-lock frequency ($\omega 1$) varied from 0–600 Hz, TSL (length of the spin-lock pulse) varied from 1 ms to 38 ms (5 steps) and scan time for each TSL is 102 seconds. A fat suppressed single slice multi-echo spin-echo pulse sequence was used for $T_2$ mapping with the same FOV and location and echo times (TE) of 15, 30, 45 and 60 ms. The total scan time for multiecho spin-echo sequence was 7 minutes.

The image data was processed offline on an SGI workstation with custom built routines written in IDL language (RSI Tech., Boulder, Colo.). $T_{1\rho}$ relaxation maps were computed by fitting the image pixel intensity as a function of TSL to the Equation 4.

$$M_y(TSL) = M_o e^{-(TSL/T1\rho)} + K \qquad \text{(Equation 4)}$$

where $M_y$, $M_o$ and K are the components of transverse magnetization, equilibrium magnetization and a constant, respectively. Regions of interest (ROI) were manually selected by a single observer from various locations of the wrist to measure the $T_{1\rho}$ and $T_2$ relaxation times and overall trend of the $T_2$ and $T_{1\rho}$ relaxation values is similar, irrespective of the size of the ROI. The calculated $T_{1\rho}$ and $T_2$ values are an average of several pixels from an ROI. The elliptical ROIs had a long axis of approximately 15 pixels. Contrast was calculated from the following formula: $(S_S - S_M)/S_S$, where $S_S$ and $S_M$ were the signal intensities of a region of interest in cartilage and bone marrow, respectively. Signal to noise ratio (SNR) was calculated by dividing the signal intensity of the cartilage with signal intensity in the noise region. Statistical analysis was performed with 2-tailed students' t-test from the department of statistics, UCLA (http:calculators.stat.ucla.edu).

Several ROIs within the wrist joint were manually selected in different locations from each map. Average $T_{1\rho}$ at 500 Hz and $T_2$ relaxation values for all the volunteers from various locations were obtained. The variation of $T_{1\rho}$ from the selected locations as a function of $\omega_1$ was plotted and an exponential increase of $T_{1\rho}$ relaxation values was observed up to a $\omega_1$ of 500 Hz. This data shows that there is $T_{1\rho}$ dispersion in the range of $\omega_1$ studied. $T_{1\rho}$-relaxation shows different dispersive characteristics in various locations of the wrist joint. $T_{1\rho}$ values are 32–63% higher than $T_2$ relaxation values at the selected locations. Based on the Collins model, the amount of SAR was calculated with the coil at 63.75 MHz for the parameters used in the $T_{1\rho}$ sequence. The calculated SAR was 0.8 W/Kg which is far below the maximum FDA allowable limit of 12 W/kg.

Figure 5:
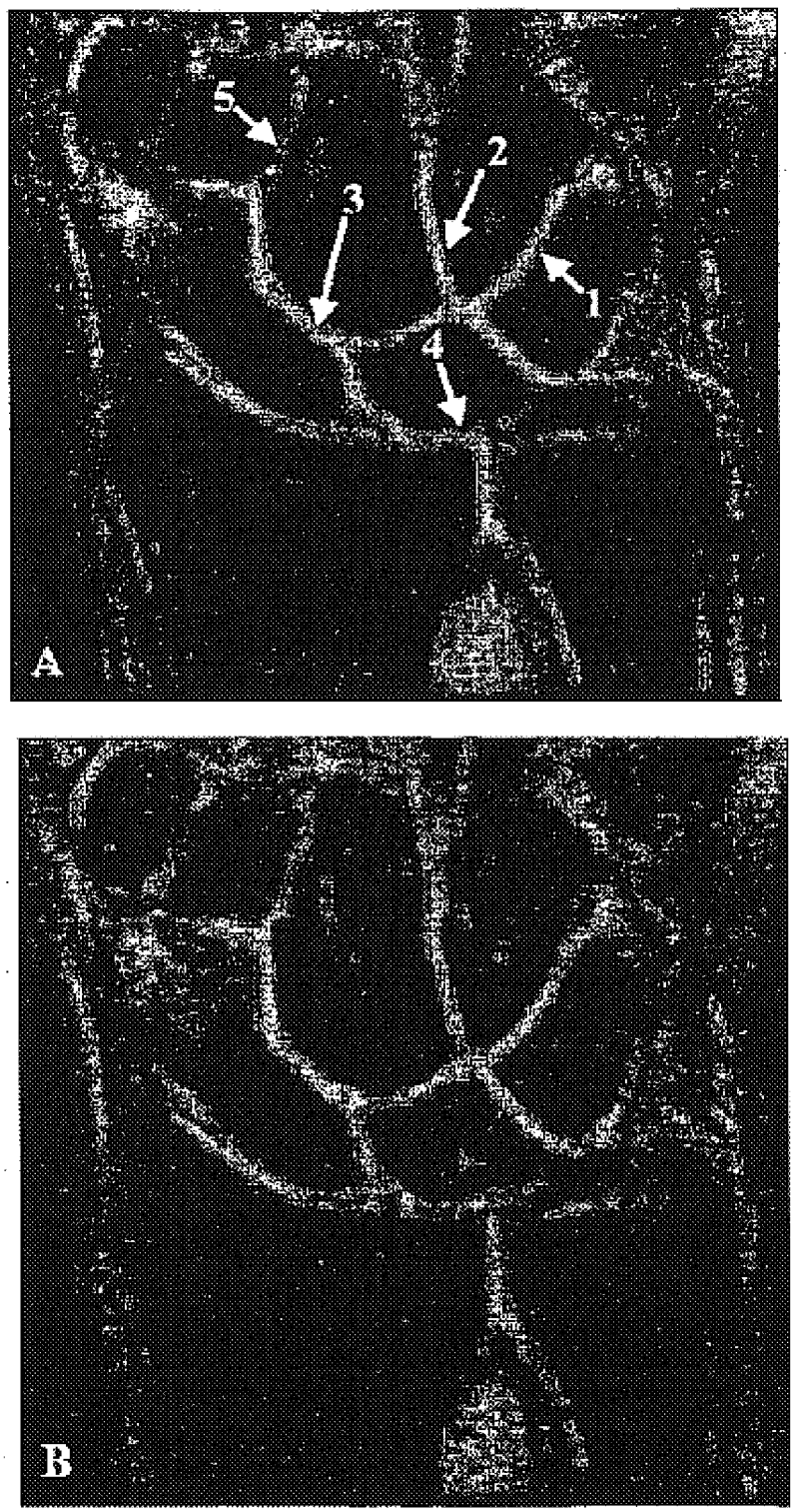
FIG. 5A shows a $T_2$ weighted image of a coronal slice.
FIG. 5B shows a $T_{1\rho}$-weighted image of the coronal slice of FIG. 5A.

A typical coronal slice of the $T_2$ weighted image (FIG. 5A) and the corresponding $T_{1\rho}$-weighted image at a $\omega_1$ of 500 Hz (FIG. 5B) are displayed in FIG. 5. The Figures show the higher SNR and better contrast between cartilage and surrounding carpal bones with reasonable fat signal suppression in the $T_{1\rho}$-weighted image when compared to the $T_2$-weighted image. The improved SNR (20–35%) and contrast (33–38%) at selected locations on the $T_{1\rho}$-weighted images with respect to $T_2$-weighted images allowed easy delineation of the cartilage from the surrounding fat.

Figure 6:
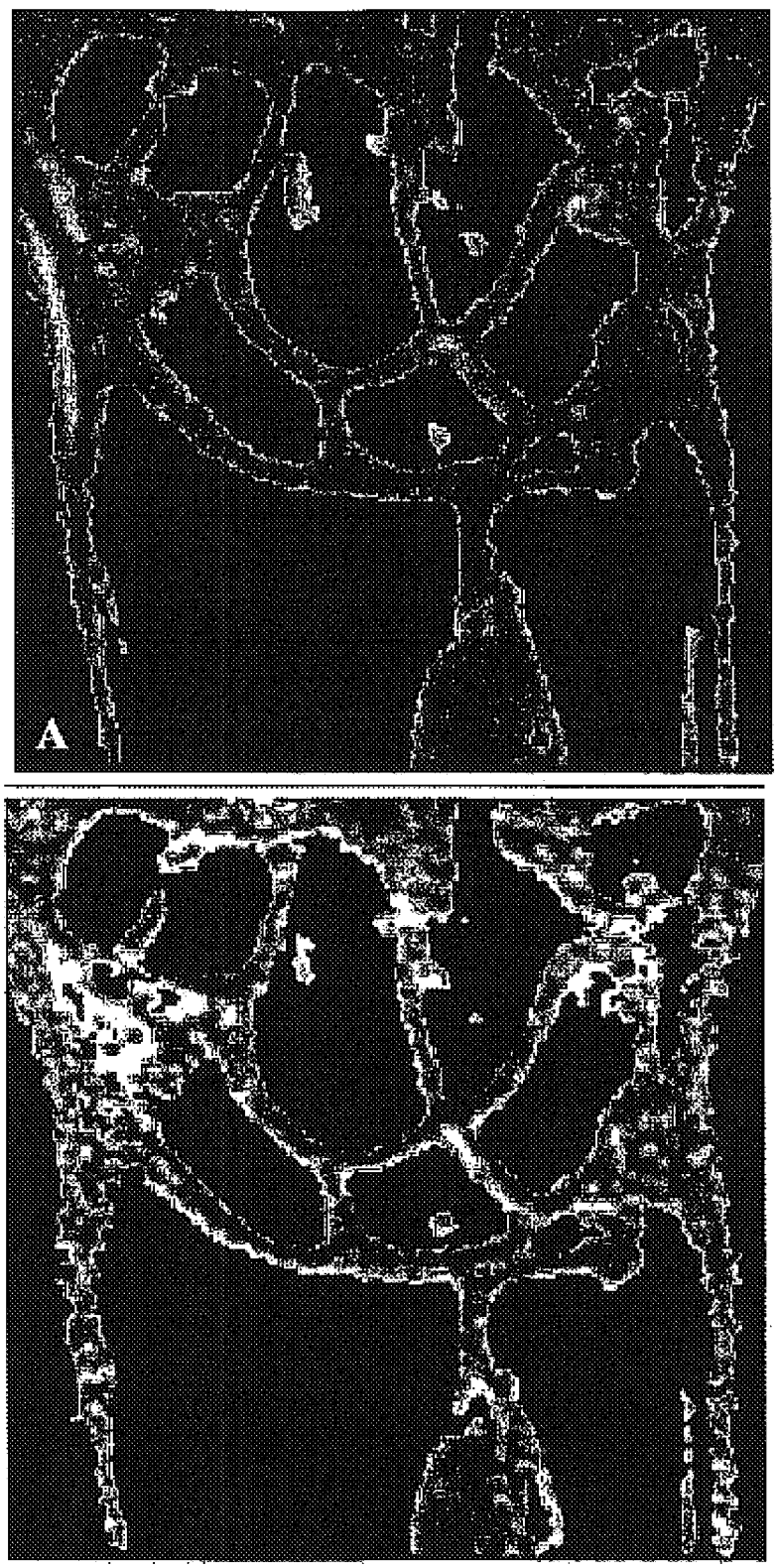
FIG. 6A shows a $T_2$ relaxation map of a coronal slice.
FIG. 6B shows a $T_{1\rho}$-weighted relaxation of map of the slice of FIG. 6A.

FIG. 6A is a $T_2$-weighted relaxation map constructed from a series of $T_2$-weighted images, while 6B is $T_{1\rho}$-weighted relaxation map constructed from a series of $T_{1\rho}$-weighted images in which each pixel in the maps represents a relaxation value. These maps clearly show the articular cartilage surrounding the major bones of the wrist. From the relaxation maps, it was observed that $T_{1\rho}$ relaxation times are greater than $T_2$ relaxation times at every location in all the individuals. The variation of $T_{1\rho}$ in selected locations plotted as a function of $\omega_1$ shows an exponential increase of $T_{1\rho}$ relaxation values up to a $\omega_1$ of 500 Hz. Thus, there is $T_{1\rho}$ dispersion in the range of $\omega 1$. $T_{1\rho}$-relaxation shows different dispersive characteristics in selected locations of the wrist joints.

Example 2

Qualitative Validation

To confirm the improved contrast of $T_{1\rho}$ MR images over $T_2$ MR images for delineating tumors and gliomas, $T_{1\rho}$ maps and $T_2$ maps of the brain were computed and compared. Additionally, the $T_{1\rho}$ times dependence on spin-locking amplitude ("$T_{1\rho}$ dispersion") was computed to show changes in $T_{1\rho}$ associated with pathology.

The $T_{1\rho}$ and $T_2$ maps of the brain were calculated from MR images from four healthy male volunteers (ages 30–40 years) on a 1.5T GE Signa scanner using the standard head-coil. A 2D single-slice spin-echo-based $T_{1\rho}$ imaging sequence was used. In this pulse sequence, a $\pi/2$ ($\phi=0°$)-spin-lock ($\phi=90°$)-$\pi/2$ ($\phi=180°$) pulse-cluster was preencoded to a fast-spin-echo (FSE) sequence. Imaging parameters were TE/TR=17/4000 ms, FOV=24 cm×24 cm, slice thickness=3 mm with 256×128 matrix size and 8 echoes per TR. The total imaging time was 1 minute. The pulse-width of each hard 90° pulse was 200 µs. $T_{1\rho}$ maps were generated from $T_{1\rho}$-weighted images by varying TSL between 15–100 ms with a fixed SL amplitude ($B_1$) of 500 Hz. $T_{1\rho}$ dispersion data was obtained on one individual by obtaining $T_{1\rho}$ maps for five different $B_1$ values ranging from 62 to 500 Hz. $T_{1\rho}$ maps were generated for each pixel by fitting the signal from each TSL to an exponential decaying curve. $T_2$-weighted images with a multi-echo, spin-echo sequence with echo times (TE=30, 60, 90, 120 ms) were used to generate $T_2$ maps by fitting pixel intensities to an exponential decaying curve as well. Regions of interest of 10×10 pixels were selected in each map by a single user to measure average $T_{1\rho}$ and $T_2$ of cerebrospinal fluid (CSF) in the ventricles, superficial white matter (WM) and cortical gray matter (GM). The average $T_{1\rho}$ and $T_2$ values from the four healthy volunteers were obtained where the variation in CSF values is due to partial voluming of choroids plexus and peri-ventricular brain tissue. Average $T_{1\rho}$ values for gray matter, white matter and cerebrospinal fluid were 85±3, 99±1 and 1496±213 ms at a spin-locking field of 500 Hz, respectively.

Figure 7:
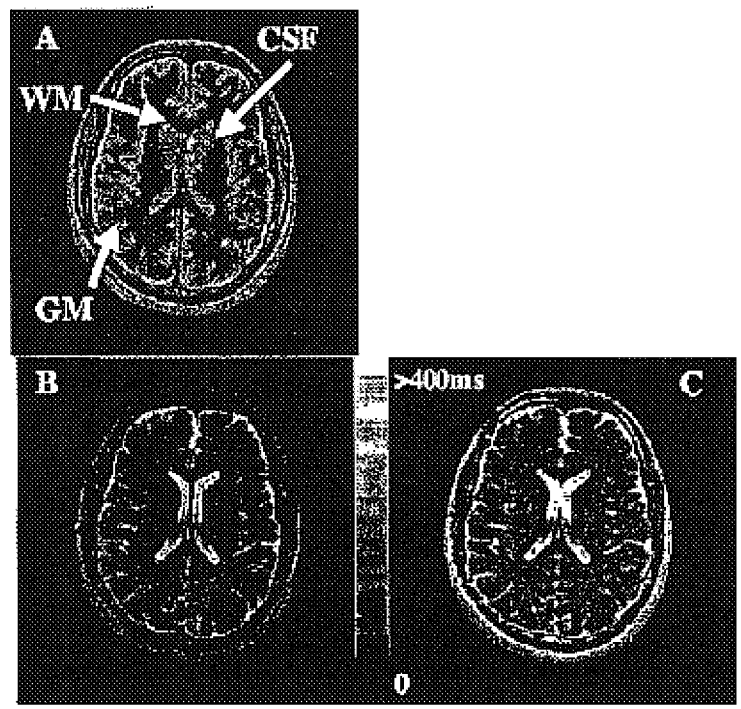
FIG. 7A shows an in vivo $T_{1\rho}$-weighted MR image of the brain of a healthy volunteer.
FIG. 7B shows the $T_2$ map and FIG. 7C shows the $T_{1\rho}$ map, respectively, of the image of FIG. 7A.

FIG. 7A shows an in vivo $T_{1\rho}$-weighted MR image of the brain of a healthy volunteer. FIGS. 7B and 7C show the corresponding $T_2$ map and $T_{1\rho}$ map, respectively. As shown in FIG. 7, the $T_{1\rho}$ map has a greater dynamic range of than the $T_2$ map. The reported $T_{1\rho}$ and $T_2$ values were averaged in 10×10 pixels in three regions indicated: gray matter (GM), white matter (WM) and cerebrospinal fluid (CSF). $T_{1\rho}$ dispersion was observed in the human brain in vivo. Average $T_{1\rho}$ values for GM, WM and CSF were 32%, 29% and 319%, respectively, higher than corresponding $T_2$ values. In part, this difference is due to relative insensitivity of $T_{1\rho}$ to diffusion, leading to an improved signal-to-noise ratio.

Example 3

Self-Compensating Spin-Locking Pulse Validation

To analyze artifacts in $T_{1\rho}$ imaging, and establish their relationship to $B_1$ inhomogeneity, and to determine and validate the dependence of these artifacts on spin-locking time and $B_1$, the following study was conducted. In the course of the study a novel self-compensating spin-locking pulse was developed to reduce these artifacts.

In MR imaging applications, every coil has some degree, of $B_1$ inhomogeneity. Where there are variations in the amplitude, $B_1$, the first and second RF pulses in the MR imaging pulse sequence perform some arbitrary flip angle, θ. Also, even if the spin-locking amplitude is small, it is applied for a comparatively long time, resulting in large rotations. Areas with a large $B_1$ gradient exhibit large spatial variations in flip angle and rotation, resulting in pronounced artifacts. Given that image artifacts arise from a rotation which occurs during the spin-locking pulse, phase-shifting the second half of the spin-locking pulse by 180° with respect to the first half, exactly cancels this rotation and reduces such artifacts, without requiring knowledge of regional $B_1$.

In this study, simulations were performed using the Interactive Data Language (IDL, RSI, Boulder, Colo.) programming environment on a Silicon Graphics workstation (Mountain View, Calif.). Artificial $B_1$ maps were generated with linear gradient and Gaussian shapes, using dimensionalities identical to experimentally obtained images, and a range of $B_1$ values also similar to those obtained experimentally. Artifacts were calculated using Equation 5:

$M_x=0$, $M_y=0$, $$M_z=\sin^2\theta \cdot e^{-TSL/T_{1\rho}} + \cos^2\theta \cos\alpha \cdot e^{-TSL/T_{2\beta}} \quad \text{(Equation 5)}$$

where $\theta=\gamma B_1 \tau$, and $\alpha=\omega_{1y}$, $TSL=P_y B_1$ TSL, where $B_1$ is the maximum RF amplitude achievable at a given point, τ is the normal $\pi/2$ pulse width, P is a parameter indicating the spin-lock amplitude expressed as a fraction of the maximum $B_1$, i.e., $B_{s1}=P \times B_1$, and TSL is the spin-locking time. The conventional and self-compensating spin-locking pulse sequences were created by modifying the General Electric (Milwaukee, Wis.) fast spin-echo pulse sequence, utilizing the EPIC programming language. MR images of a water phantom were obtained on a 4T whole body GE Signa scanner using a solenoid coil tuned to the $^1$H 200 Larmor frequency (170 MHz). Imaging was performed using a TR of 2 seconds, effective TE of 17 ms, field of view of 8 cm, slice thickness of 3 mm, bandwidth of 15 kHz, and acquisition matrix of 256×128. Initially, calibration of the hard pulses was performed by turning off the spin-locking pulse and $P_2$, while retaining $P_1$. The transmit gain (TG) was then titrated until the signal was minimized, implying that $P_1$ was a $\pi/2$ pulse. TG was fixed at this value.

Images to calculate the $B_1$ map of the solenoid coil were then obtained. A baseline image was first obtained with both hard pulses ($P_1$ and $P_2$) activated. Since $P_1$ and $P_2$ were 180° apart in phase, they canceled each other out. The crusher gradient had no effect, and the resulting image represented maximum signal intensity (effectively, a flip angle of zero for $P_1$ and $P_2$). The $P_2$ hard pulse was then turned off, and images were acquired with varying amplitudes of $P_1$. As the amplitude of $P_1$ approached $\pi/2$, the crusher gradient destroyed more magnetization, and the image signal intensity was reduced. In other words, for a flip angle θ, induced by $P_1$, image signal intensity followed cos (θ).

A total of five $P_1$ amplitudes were utilized, varying from 31 to 92% of the maximum amplitude. The arc-cosine of image signal intensity was plotted as a function of the amplitude of $P_1$ for each pixel, and the slope of a linear fit yielded a value for $B_1$ at each pixel. Hard pulses $P_1$, $P_2$, and a standard spin-locking pulse were then activated. The amplitudes of $P_1$ and $P_2$ were simultaneously varied to generate artifacts. Images were obtained with a variety of hard pulse amplitudes, spin-locking pulse amplitudes, and spin-locking times. Using the experimentally determined $B_1$ map, artifacts were simulated using Equation 5, and the results were compared to the experimentally obtained image artifacts.

Finally, the standard spin-locking pulse was exchanged for a "self-compensating" spin-locking pulse for fixed TSL and $B_1$, and the amplitudes of $P_1$ and $P_2$ were again simultaneously varied. Artifacts obtained with the standard spin-locking pulse were compared to those obtained with the "self-compensating" spin-locking pulse. Artifacts were quantified by computing the standard deviation of signal intensity divided by the mean signal intensity, i.e., percent variation, within a central region of interest.

Figure 8:
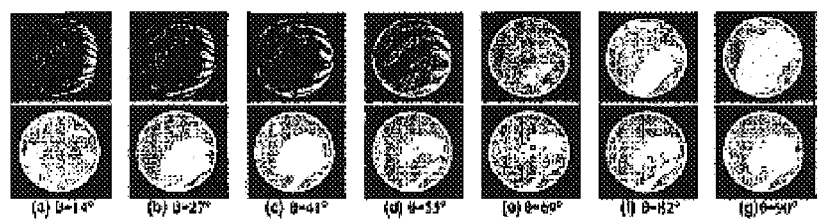
FIG. 8 shows images obtained with a conventional spin-locking pulse compared to images obtained with a self-compensating spin-locking pulse for a range of flip angles.

The images obtained with the conventional spin-locking pulse and the respective images obtained with a self-compensating spin-locking pulse for a range of flip angles are shown in FIG. 8. In FIG. 8, images in the top row were obtained with a conventional spin-locking pulse, while the images in the bottom row were obtained with a self-compensating spin-locking pulse, for the range of flip angles shown. Use of the self-compensating spin-locking pulse resulted in remarkably consistent images, despite large changes in the flip angles, $P_1$ and $P_2$. The variation in image signal intensity was plotted as a function of nominal flip angle for images acquired with the conventional and self-compensating spin-locking pulses. The variation in signal intensity is strongly dependent on flip angle when the conventional spin-locking pulse is used, and it was found that the self-compensating spin-locking pulse dramatically reduces this dependence, resulting in homogeneous images despite a poorly calibrated flip angle.

Thus, use of the self-compensating spin-locking pulse facilitates quantitative $T_{1\rho}$ imaging despite variations in $B_1$. However, it should be noted that the second half of the spin-locking pulse will not exactly compensate for the first half if there is significant motion of spins over a gradient of $B_1$. Also, while the artifacts arising from spatial variation in $B_1$ are corrected, a variation in $B_1$ affects spin-locking amplitude, which translates into an effect on measured $T_{1\rho}$ times. Therefore, $T_{1\rho}$ values and $T_{1\rho}$ relaxation time maps measured in the presence of an inhomogeneous $B_1$ field must take this into consideration, since spatial variations in $T_{1\rho}$ may actually be due to spatial variations in $B_1$ rather than properties of the sample itself.

In this study, the self-compensating spin-locking pulse was split into two halves of opposed phase. However, in principle, the pulse can be divided into any arbitrary number of smaller pulses, as long as the positively and negatively phased portions of the pulse are balanced. Additionally, $T_{1\rho}$-weighted imaging with a self-compensating spin-locking pulse allowed for the use of a surface coil. This study showed that despite large spatial variations in $B_1$, use of this pulse sequence appears to generate relatively artifact-free images, facilitating quantitative $T_{1\rho}$ imaging while exploiting the sensitivity and convenience of surface coils. Also, with appropriate manipulation of the preparatory pulse cluster, the same imaging sequence can be utilized for $B_1$ mapping, as well as for data acquisition.

Example 4

3D $T_{1\rho}$-Weighted Pulse Sequence Validation

The following study was performed to validate the 3D $T_{1\rho}$-weighted pulse sequence. The MRI experiments were performed on a 1.5 T GE clinical MRI system.

Specimen Imaging

The $T_{1\rho}$ values measured with the 3D $T_{1\rho}$-weighted sequence were confirmed to be the same as those obtained from a previously validated 2D $T_{1\rho}$ imaging sequence. 3D and 2D $T_{1\rho}$ maps were generated of an intact bovine patella specimen obtained from a local slaughterhouse (Beirig Bros.; Vineland, N.J.) within hours of sacrifice using a custom-built, 15 cm-diameter, quadrature birdcage knee-coil. Care was taken to prevent motion of the patella from mechanical vibrations of the gradients during imaging. A groove was cut along the length of the articular surface with a saw and the specimen was wedged onto a plastic divider. The imaging parameters were TE/TR=2.2/200 ms resulting in a total imaging time of 7 minutes for 16 slices of FOV=10 cm×10 cm, 1.5 mm slice thickness with 256×128 matrix size, and $\alpha=35°$. Single-slice 2D images were obtained with TE/TR=17/3000 ms, and echo train length of 4 echoes resulting in an imaging time of 1.6 minutes for a single 3 mm slice with a FOV=10 cm×10 cm and the same pixel size as the 3D sequence. In both 3D and 2D sequences, the pulse-width of each hard 90° pulse was 200 μs, and the $B_1$ of the SL pulse was fixed at 500 Hz and the TSL time was varied from 25–165 ms in eight increments.

The $T_{1\rho}$-weighted images were processed offline on a G4 Titanium computer (Apple Computer; Cupertino, Calif.) with custom software written in IDL (RSI; Boulder, Colo.) data processing language.

The images were used to generate $T_{1\rho}$ maps by fitting each pixel to Equation 1, (or $e^{-TSL/T1\rho}$ for the 2D FSE data), with a least-squares algorithm and assuming $T_1=1$ second for articular cartilage (Borthakur, et al., *Osteoarthritis Cartilage* 8:288–293 (2000)). As discussed below, this assumption results in only a small error in the calculated $T_{1\rho}$ values. The accuracy of the fits was determined from a sum of the difference squared between the data points and the fit.

The maps calculated from the 2D and 3D $T_{1\rho}$ sequences resulted in similar calculated $T_{1\rho}$ values in the cartilage. In a specific region investigated, the average $T_{1\rho}$ calculated from the 3D and 2D sequences were 84±2 ms and 80±3 ms, respectively. The error between the data points and the fit was less than $1\times10^{-5}$ confirming that the fit was very accurate. $T_{1\rho}$ values calculated by the two sequences were very similar, hence the 3D sequence is a reliable imaging alternative to the 2D method.

Temperature Mapping

The RF energy deposited by a coil during MR imaging results in focal temperature increases (Chen, et al., *Magn. Reson. Med.* 29:386–390 (1993)). One method of temperature mapping uses $CoCl_2$-doped agarose gel phantom (Shapiro, 2002). In this technique, MR images of the phantom are acquired before and after running a "test" pulse sequence. The phase difference between these pre and post images, resulting from the temperature-dependent chemical shift of the water peak, can be used to generate phase-difference maps ($\Delta\phi$) that can be directly converted to temperature maps ($\Delta T$) by the following equation (MacFall, et al., *Med. Phys.* 23:1775–1782 (1996)):

$$\Delta T = \frac{\Delta \phi}{360 \cdot \gamma B_0 \cdot K \cdot TE} \quad \text{(Equation 6)}$$

where $B_0$ is the magnetic field strength (1.5T), TE is the echo time of the imaging sequence (20 ms, in this experiment) and K is the "temperature sensitivity," i.e., the chemical shift of the water in the $CoCl_2$-doped phantom. K was previously measured as −0.041 ppm/° C., which is four times greater than that of distilled water (−0.011 ppm/° C.). The factor of 360 accounts for the phase degrees in every cycle.

Using this technique, the temperature increase was determined that was generated by the 3D $T_{1\rho}$ pulse sequence in a cylindrical 160 mM $CoCl_2$-doped 4% (w/v) agarose gel phantom with dimensions that mimic a typical knee-joint (10 cm diameter and 10 cm long) weighing 5 kg. The phantom was placed in a MRI scanner room overnight to equilibrate with the ambient temperature. Phase difference maps were generated for every slice from two image sets obtained with a 2D multi-slice gradient echo sequence with FOV=16 cm×16 cm, slice thickness=3 mm, TE/TR=20/34 ms and with 256×128 pixels. With this sequence, a "pre-test" data set of six slices was obtained in under 30 seconds. Following this, the "test" 3D $T_{1\rho}$ sequence was run with a TR calculated from Equation 3 for the maximum values of the parameters, fixed $B_1$ (400 Hz) and TSL (45 ms), for use in vivo. Then, a "post-test" 2D multi-slice experiment was performed.

The 3D sequence was run twice more with reduced TRs (100 ms and 75 ms) and two more "post-test" data sets were acquired after each 3D test. The maximum meter reading from a power monitor, attached to the RF output from the MRI scanner, was recorded during each 3D scan. Using Equation 6, the three post-test data sets were used to generate temperature maps using a pixel-by-pixel determination of the phase difference between the post-test data sets and the pre-test data set. The temperature maps were acquired without waiting for the phantom to cool to room temperature. As a result, the measured increase in temperature in the second and third temperature maps was cumulative.

The power meter readings and imaging times were used to calculate the expected temperature rise by assuming that all the power was converted to heat in the phantom, and the specific heat of the 4% agarose gel phantom was that of pure water (4.18 J/g/K) in each experiment.

Figure 9:
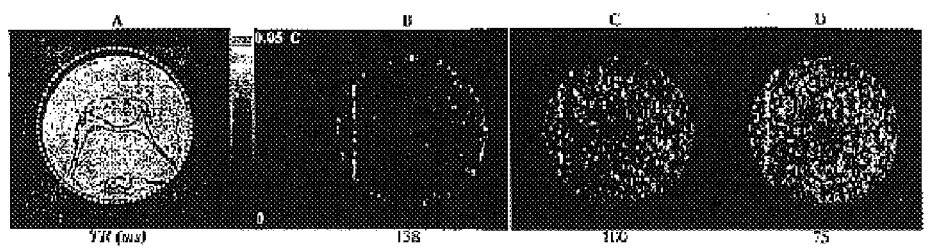
FIGS. 9A–D show the temperature change in a series of "post-test" images of a knee.

FIG. 9A shows the position of the agarose gel phantom within the coil and the overlaid sketch shows the typical position of the knee inside the coil. In order to expedite $T_{1\rho}$ MRI in vivo, the $B_1$ of the SL pulse was decreased to 400 Hz and the TSL was kept at 45 ms. This resulted in a calculated SAR of 1.62 J/kg, which implied a minimum TR of 138 ms which met the FDA mandated safety guidelines. With these parameters, the measured increase in temperature in the phantom after the 3D sequence was only 0.015° C. (FIG. 9B). As a test, the 3D sequence was run with a higher duty cycle, and the cumulative temperature rose to only 0.029° C. (FIGS. 9C and D). No significant "hot spots" were observed in any of the images. Accordingly, this example shows that the imaging parameters did not result in any significant temperature change, and therefore are safe for use in imaging humans in vivo.

Furthermore, calculated ΔT yielded results greater that what was actually measured in the phantoms, suggesting that only a fraction of the power put into the coil was heating the phantom. This was not a surprising result, since there could be other mechanisms of energy dissipation during the experiments that were not accounted for in the calculated ΔT. Additionally, since the electric conductivity of the phantom is greater than human tissue (Gabriel, et al., *Phys. Med. Biol.* 41:2251–2269 (1996)), and the fact that tissue contains vessels and blood flow to facilitate heat dissipation, these experiments actually overestimate the temperature rise.

In Vivo Imaging

After determining the safe limits of the imaging parameters, both through the calculation of SAR and temperature mapping, a 3D $T_{1\rho}$-weighted, sagittal MR data set was obtained of the knee joint of a 30-year old healthy volunteer. To ensure that SAR limits are not exceeded, imaging parameters were set at $B_1$=400 Hz, TSL=45 ms, and TR=2.2/140 ms. Other parameters were TE=2.2 ms FOV=10 cm×10 cm, slice thickness of 1.5 mm, such that a data set of 16 slices was obtained under 5 minutes.

Figure 10:
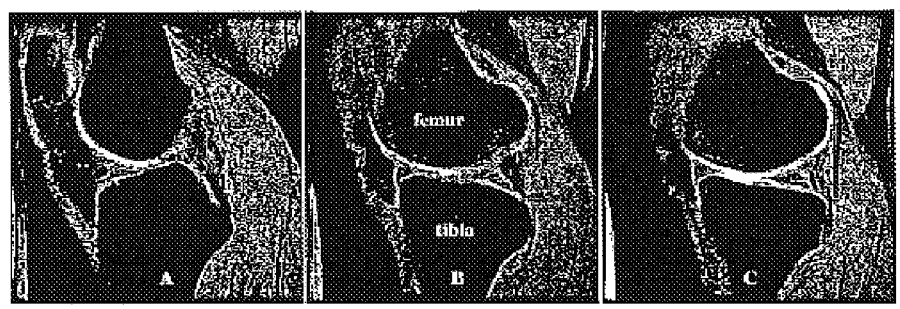
FIGS. 10A–C show representative slices from a 3D data set.

Using the 3D sequence described above, the $T_{1\rho}$-weighted images were obtained of the human knee joint. FIGS. 10A–C show representative slices from a 3D data set of 16 slices that were acquired in less than 5 minutes with high SNR (29:1, measured in the cartilage). In these images, the cartilage between the patella and the distal femur is clearly seen. Due to the $T_1$-weighting in the short TR gradient-echo readout, superior contrast between cartilage and other tissues is achieved. Images provided excellent delineation of patellar cartilage and suppression of signal from fatty marrow and surrounding tissues.

Figure 11:
FIG. 11 shows additional axial images of a healthy knee obtained with a 3D $T_{1\rho}$-weighted imaging sequence of the present invention.

FIG. 11 shows additional axial images of a healthy volunteer knee (30 year male, with no known abnormalities of knee) obtained with a 3D-$T_{1\rho}$-weighted imaging sequence (five slices from a 16 slice data set). The arrow indicates cartilage. This figure shows an excellent contrast between cartilage and other tissues. For FIG. 11, the in plane resolution of these images is ~390 μm with slice thickness of 3 mm.

Figure 12:
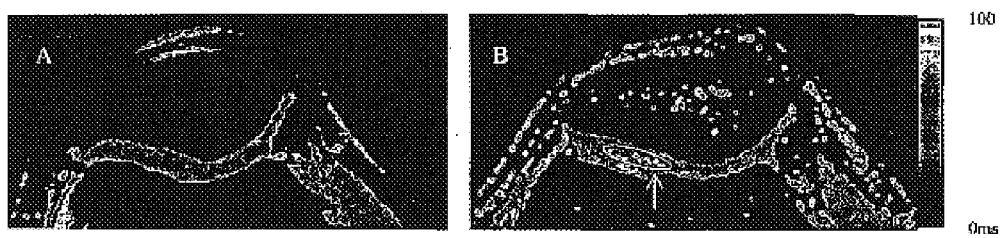
FIGS. 12A and 12B show in vivo $T_{1\rho}$ relaxation maps of human patellar cartilage.

Additionally, FIGS. 12A and B show in vivo $T_{1\rho}$ relaxation maps of human patellar cartilage. These are maps of one slice from a 3D data set of 16 slices. FIG. 12A shows a $T_{1\rho}$ relaxation map of a healthy volunteer (30 year male, with no known abnormalities of knee). The average $T_{1\rho}$ relaxation in this healthy tissue is 50±5 ms. For FIG. 12A. the in plane resolution in this map is 390 μm with a slice thickness of 3 mm. FIG. 12B shows a $T_{1\rho}$ relaxation map of a subject with clinical symptoms of osteoarthritis (40 yr female, absence of cartilage abnormalities on radiographs). The Rheumatologist and Orthopedist diagnosed the subject with osteoarthritis and the subject is on medication for about a year. For FIG. 12B, the in plane resolution in this map is 312 μm with a slice thickness of 1.5 mm. There is a substantial increase in $T_{1\rho}$ relaxation numbers in the ROI shown ($T_{1\rho}$ values are ~36% higher compared to the healthy tissue). This clearly demonstrates the feasibility of quantifying the degree of abnormality in cartilage.

Figure 13:
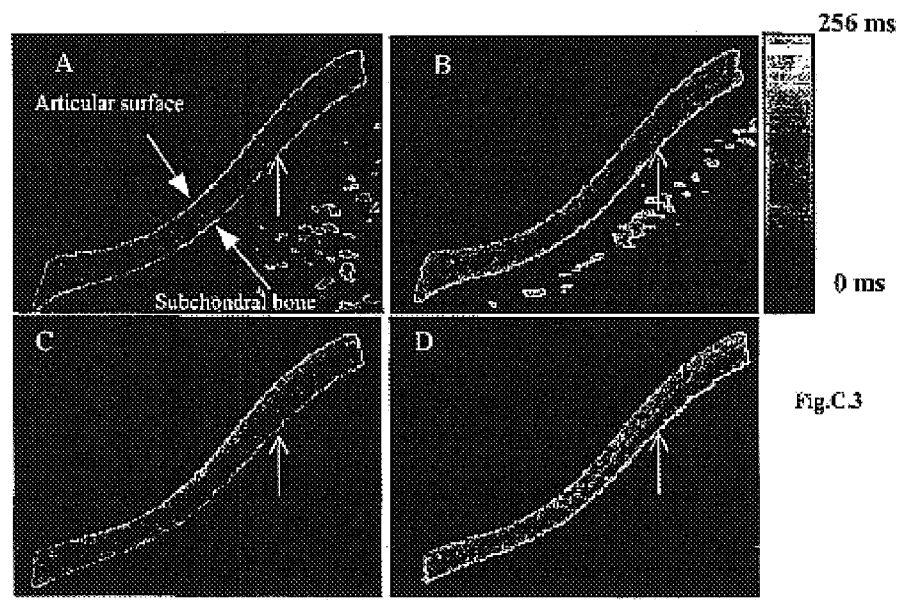
FIGS. 13A–D show the comparison of $T_2$ and $T_{1\rho}$ maps of control and 40% of PG depleted bovine patellae.

Finally, FIGS. 13A–D show the comparison of $T_2$, and $T_{1\rho}$ maps of control and 40% of PG depleted bovine patellae. As shown, FIG. 13A is a control $T_2$ map, FIG. 13B is a control $T_{1\rho}$ map, FIG. 13C is a 40% PG depleted $T_2$ map and FIG. 13D is a 40% PG depleted $T_{1\rho}$ map. The color bar scale shows the relaxation numbers from 0 to 256 ms Example 5

Pulse Sequence for 3D $T_{1\rho}$-Weighted MRI with a Surface Coil

In order to obtain artifact-free $T_{1\rho}$-weighted MRI using surface coils, the following study was performed to validate combining a 3D $T_{1\rho}$-weighted pulse sequence for MR imaging with a self-compensating spin-locking pulse sequence.

On a 4T GE clinical MRI system, $T_{1\rho}$-weighted images of a cylindrical (7 cm outer-diameter) agarose gel phantom and a knee joint of a 30-year old healthy volunteer were obtained with a custom-built surface coil (7 cm inner-diameter). MRI parameters were TE/TR=2.2/140 ms, FOV=10 cm×10 cm, 3 mm slice thickness with 256×128 matrix size and α=30°. Total imaging time was 4.7 minutes for a data set of 16 slices. The pulse-width of each nominal hard 90° pulse was 200 μs, and the amplitude of the SL pulse was 500 Hz. In one set of experiments, the SL pulse was divided into even segments of equal duration, with the phase of each segment alternating between ±90°, i.e., "self-compensating" SL pulse. In a second set of experiments, a "conventional" single SL pulse with ϕ=90° was used.

Figure 14:
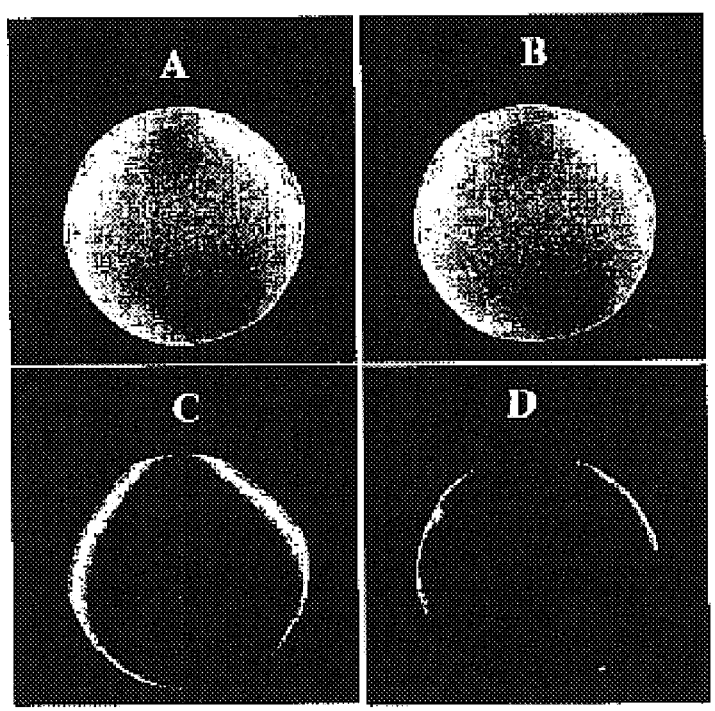
FIGS. 14A–D show $T_{1\rho}$-weighted MR images of an agarose gel phantom obtained with self-compensating or conventional methods with a surface coil.
Figure 15:
FIG. 15A shows in vivo $T_{1\rho}$-weighted axial MR image of a human knee joint obtained with a surface coil using the conventional pulse sequence.
FIG. 15B shows the same image using the self-compensating pulse sequence.

FIGS. 14A–D shows $T_{1\rho}$-weighted MR images of an agarose gel phantom obtained with the "self-compensating" (FIGS. 14A and 14B) or the "conventional" (FIGS. 14C and 14D) methods. In FIG. 14A, the SL pulse is divided into 4 segments of 1 ms each (i.e., TSL=4 ms), and in FIG. 14B, two segments of 4 ms each (i.e., TSL=8 ms). These, and two more images obtained at longer TSL times, were used to generate a $T_{1\rho}$ map. For comparison, the image in FIG. 14C was obtained with one SL pulse of 4 ms duration (TSL=4 ms). The image in FIG. 14D was obtained with the SL pulse turned off, but the 4 ms delay was maintained between the 90° pulses. FIGS. 15A and B show in vivo $T_{1\rho}$-weighted axial MR images of the human knee joint obtained with a surface coil, with the conventional (FIG. 15A), and self-compensating (FIG. 15B) pulse sequences. (The arrows in FIG. 15B indicate the plane of the surface coil). Reduction of artifacts in the cartilage and inside the patella in the image in FIG. 15B are obvious.

The disclosures of each patent, patent application and publication cited or described in this document are hereby incorporated herein by reference, in their entirety.

While the foregoing specification has been described with regard to certain preferred embodiments, and many details have been set forth for the purpose of illustration, it will be apparent to those skilled in the art without departing from the spirit and scope of the invention, that the invention may be subject to various modifications and additional embodiments, and that certain of the details described herein can be varied considerably without departing from the basic principles of the invention. Such modifications and additional embodiments are also intended to fall within the scope of the appended claims.

What is claimed is:

1. A 2D multi-slice $T_{1\rho}$-weighted pulse sequence for magnetic resonance imaging, comprising in sequential order:
   a first radio frequency pulse for selectively exciting a band of spins;
   a second radio frequency pulse, wherein the second pulse is a spin-locking pulse divided into at least two segments, wherein the spin-locking segments have 90° alternating phase shift for spin-locking in a transverse plane of the spins;
   a third radio frequency slice-selective pulse, phase-shifted 180° from the first radio frequency pulse, which restores spin-locked magnetization to a longitudinal axis for imaging with any pulse sequence; and
   a strong crusher gradient applied to destroy residual transverse magnetization.

2. The pulse sequence of claim 1, wherein each of the first and third radio frequency pulses is a $\pi/2$ pulse.

3. A method of magnetic resonance imaging using a 2D multi-slice $T_{1\rho}$-weighted sequence, comprising:
   applying a first radio frequency pulse for selectively exciting a band of spins;
   applying a spin-locking pulse, wherein the spin-locking pulse further comprises at least two segments with 90° alternating phase shift for spin-locking in a transverse plane of the spins;
   applying a third radio frequency slice-selective pulse, phase-shifted 180° from the first radio frequency pulse which restores spin-locked magnetization to a longitudinal axis for imaging with any pulse sequence; and
   applying a strong crusher gradient applied to destroy residual transverse magnetization.

4. The method of claim 3, wherein applying each of the first and third radio frequency pulses further comprises applying a $\pi/2$ pulse.

5. A self-compensating spin-locking pulse sequence for correcting artifacts in $T_{1\rho}$-weighted magnetic resonance imaging, comprising in sequential order:
   a first radio frequency pulse for a selected θ that nutates magnetization into a transverse plane;
   a spin-locking pulse, wherein the spin-locking pulse further comprises at least two segments that are 90° phase-shifted and have an amplitude $B_{s1}$, applied for time period TSL;
   a second radio frequency pulse for a selected θ applied, phase-shifted by 180° to return a $T_{1\rho}$-relaxed magnetization to a longitudinal axis for imaging; and
   a crusher gradient to dephase residual transverse magnetization.

6. The sequence of claim 5, wherein each of the first and second radio frequency pulses for a selected θ is a $\pi/2$ pulse.

7. A method of correcting artifacts in $T_{1\rho}$-weighted imaging with the self compensating spin-locking pulse, comprising applying a three-pulse preparatory cluster to an imaging sequence, including the following steps:
   applying a first radio frequency pulse for a selected θ that nutates magnetization into a transverse plane;
   applying a spin-locking pulse, wherein the spin-locking pulse further comprises at least two segments that are 90° phase-shifted and have an amplitude $B_{s1}$, applied for time period TSL;
   applying a second radio frequency pulse for a selected θ phase-shifted by 180° to return a $T_{1\rho}$-relaxed magnetization to a longitudinal axis for imaging; and applying a crusher gradient to dephase residual longitudinal magnetization.

8. The method of claim 7, further comprising applying the three-pulse preparatory cluster pre-appended to a spin-echo-based imaging sequence.

9. The method of claim 7, further comprising applying the three-pulse preparatory cluster pre-appended to a gradient echo-based imaging sequence.

10. The method of claim 7, wherein $B_{s1}$ is a fraction of a maximum available radio frequency field $B_1$.

11. The method of claim 7, wherein each of the first and second radio frequency pulses is a $\pi/2$ hard pulse.

12. A 3D $T_{1\rho}$-weighted pulse sequence for magnetic resonance imaging, comprising a pulse cluster pre-encoded with a gradient echo sequence, wherein the pulse cluster further comprises in sequential order:
   a first $\pi/2$ hard pulse;
   a spin-locking pulse having amplitude $B_1$;
   a second $\pi/2$ hard pulse phase shifted 180° from the first hard pulse; and
   a strong crusher gradient applied to destroy residual magnetization in a transverse plane and inhibit formation of unwanted coherences.

13. The pulse sequence of claim 12, wherein the spin-locking pulse further comprises two or more segments with alternating phases.

14. The pulse sequence of claim 13, wherein spin-locking pulse segments are +90° and -90° phase-shifted from the phase of the first $\pi/2$ pulse.

15. A method for magnetic resonance imaging using a 3D $T_{1\rho}$-weighted pulse sequence, comprising applying a pulse cluster pre-encoded with a gradient echo sequence, wherein applying a pulse cluster further comprises;
   applying a first $\pi/2$ hard pulse;
   applying a spin-locking pulse having amplitude $B_1$;
   applying a second $\pi/2$ hard pulse phase shifted 180° from the first hard pulse; and
   applying a strong crusher gradient to destroy residual magnetization in a transverse plane and inhibit the formation of unwanted coherences.

16. The method of claim 15, wherein the step of applying a spin-locking pulse further comprises applying a spin-locking pulse having at least two segments, wherein the at least two spin-locking segments have alternating phases for spin-locking in a transverse plane.

17. A method of obtaining 3D $T_{1\rho}$-weighted images with a coil, comprising applying a pulse cluster pre-encoded with a gradient echo sequence, wherein applying a pulse cluster further comprises;

applying a first $\pi/2$ hard pulse;

applying a spin-locking pulse having amplitude $B_1$ and having at least two segments, wherein the spin-locking segments have alternating phases for spin-locking in a transverse plane of the spins;

applying a second $\pi/2$ hard pulse, phase shifted 180° from the first hard pulse; and applying a strong crusher gradient to destroy residual magnetization in the transverse plane and inhibit formation of unwanted coherences.

18. The method of claim 17, wherein the coil is a surface coil.

19. The method of claim 17, wherein the coil is a volume radio frequency coil.

20. The method of claim 17, wherein applying spin-locking segments further comprises applying spin-locking segments +90° and −90° phase shifted from the first hard pulse.

* * * * *